US012604401B2

(12) United States Patent　　(10) Patent No.: US 12,604,401 B2
Kim　　(45) Date of Patent: Apr. 14, 2026

(54) FILM PACKAGE AND PACKAGE MODULE INCLUDING THE SAME

(71) Applicant: Samsung Electronics Co., Ltd., Suwon-si (KR)

(72) Inventor: Youngbae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 314 days.

(21) Appl. No.: 18/336,096

(22) Filed: Jun. 16, 2023

(65) Prior Publication Data

US 2024/0032195 A1　　Jan. 25, 2024

(30) Foreign Application Priority Data

Jul. 21, 2022　　(KR) ........................ 10-2022-0090263

(51) Int. Cl.
| | |
|---|---|
| *H05K 1/18* | (2006.01) |
| *H05K 1/02* | (2006.01) |
| *H05K 1/11* | (2006.01) |
| *H05K 1/189* | (2026.01) |

(52) U.S. Cl.
CPC ............. *H05K 1/118* (2013.01); *H05K 1/028* (2013.01); *H05K 1/111* (2013.01); *H05K 1/189* (2013.01); *H05K 2201/10128* (2013.01)

(58) Field of Classification Search
CPC ........ H05K 1/118; H05K 1/028; H05K 1/111; H05K 1/189; H05K 2201/10128
USPC ......................................... 361/749
See application file for complete search history.

(56) References Cited

U.S. PATENT DOCUMENTS

| | | | | |
|---|---|---|---|---|
| 6,054,975 A * | 4/2000 | Kurokawa | ........ | H01L 23/49572 |
| | | | | 345/206 |
| 6,590,629 B1 * | 7/2003 | Hirobe | ................ | G02F 1/13452 |
| | | | | 349/149 |
| 7,473,996 B2 * | 1/2009 | Son | ...................... | G02F 1/13452 |
| | | | | 257/E23.06 |
| 9,351,435 B2 | 5/2016 | Kim et al. | | |

(Continued)

FOREIGN PATENT DOCUMENTS

| | | |
|---|---|---|
| CN | 101820722 B | 7/2012 |
| JP | 2018-170464 A | 11/2018 |

(Continued)

*Primary Examiner* — Binh B Tran
(74) *Attorney, Agent, or Firm* — Harness, Dickey & Pierce, P.L.C.

(57) ABSTRACT

A film package includes a film substrate extending in a first direction and including a first side and a second side facing each other, the film substrate including a device region between the first side and the second side, and the film substrate including a reinforcing region adjacent to at least one side of the device region in a second direction, the second direction intersecting the first direction. The film package includes a semiconductor chip having an elongated rod shape, and the semiconductor chip on the device region of the film substrate in the first direction, interconnection patterns electrically connected to the semiconductor chip, the interconnection patterns comprising input patterns extending toward the first side on the film substrate, and output patterns extending toward the second side on the film substrate, and a protective layer on the film substrate to cover at least a portion of the interconnection patterns.

19 Claims, 11 Drawing Sheets

(56)     References Cited

U.S. PATENT DOCUMENTS

| 10,860,124 | B2 | 12/2020 | Jeong et al. |
| 11,081,503 | B2 | 8/2021 | Lee |
| 2008/0062666 | A1* | 3/2008 | Lim ...................... H05K 1/025 |
| | | | 349/150 |
| 2015/0230337 | A1 | 8/2015 | Kim et al. |
| 2020/0084888 | A1* | 3/2020 | Lee ...................... H05K 1/118 |

FOREIGN PATENT DOCUMENTS

| KR | 10-2007-0011752 A | 1/2007 |
| KR | 10-2021-0000565 A | 1/2021 |

* cited by examiner

FILM PACKAGE AND PACKAGE MODULE INCLUDING THE SAME

CROSS-REFERENCE TO RELATED APPLICATION

This application claims priority to Korean Patent Application No. 10-2022-0090263, filed on Jul. 21, 2022, in the Korean Intellectual Property Office, the disclosure of which is incorporated by reference herein in its entirety.

FIELD

Some example embodiments of the inventive concepts relate to a film package and/or a package module including the same.

BACKGROUND

In order to respond to the recent trend for miniaturization, thinness, and weight reductions of electronic products, a chip on film (COF) package technology using a flexible film substrate has been proposed. In the COF package technology, a semiconductor chip may be mounted on a film substrate by a flip-chip bonding method, and may be connected to an external device by an interconnection line. Such a COF package may be applied to a panel of a portable terminal device such as a cellular phone and a PDA, a laptop computer, or a display device.

SUMMARY

Some example embodiments of the inventive concepts provide a film package and a package module in which shrinkage of a film substrate is alleviated to reduce bonding defects of a semiconductor chip.

According to an example embodiment of the inventive concepts, a film package includes a film substrate extending in a first direction, the film substrate including a first side and a second side facing each other, the film substrate including a device region between the first side and the second side, and the film substrate including a reinforcing region adjacent to at least one side of the device region in a second direction, the second direction intersecting the first direction. The film package includes a semiconductor chip having an elongated rod shape, and the semiconductor chip on the device region of the film substrate in the first direction, interconnection patterns electrically connected to the semiconductor chip, the interconnection patterns comprising input patterns extending toward the first side on the film substrate, and output patterns extending toward the second side on the film substrate, and a protective layer on the film substrate to cover at least a portion of the interconnection patterns, and the protective layer including an opening in which the semiconductor chip is in the device region. Each of the interconnection patterns is at a pitch in a range of 10 μm to 40 μm, and wherein at least a portion of the input patterns include a bent region on the reinforcing region, and the bent region is bent at an angle within a range of 400 to 900 with respect to the second direction.

According to an example embodiment of the inventive concepts, A film package includes a film substrate including a device region in a first direction and a reinforcing region adjacent to at least one side of the device region, a semiconductor chip having an elongated rod shape in a second direction orthogonal to the first direction, and the semiconductor chip on the device region, and interconnection patterns on the film substrate, the interconnection patterns electrically connected to the semiconductor chip, and extending from the semiconductor chip onto the reinforcing region. Each of the interconnection patterns is at a pitch in a range of 10 μm to 40 μm, and at least a portion of the interconnection patterns have a bent region on the reinforcing region, and the bent region is bent at an angle within a range of 400 to 900 in the second direction.

According to an example embodiment of the inventive concepts, a package module includes a display panel, a driving printed circuit board below the display panel, and a film package that is bent between the display panel and the driving printed circuit board, the film package connecting the display panel and the driving printed circuit board, the film package configured to receive a signal output from the driving printed circuit board, and transmit the signal output from the driving printed circuit board to the display panel. The film package includes a film substrate extending in a first direction and including a first side and a second side facing each other, the film substrate including a device region between the first side and the second side, and the film substrate including a reinforcing region adjacent to at least one side of the device region in a second direction intersecting the first direction, a semiconductor chip having an elongated rod shape, and the semiconductor chip on the device region of the film substrate in the first direction, interconnection patterns electrically connected to the semiconductor chip, the interconnection patterns comprising input patterns extending toward the first side on the film substrate and output patterns extending toward the second side on the film substrate, and a protective layer on the film substrate to cover at least a portion of the interconnection patterns, and the protective layer including an opening in which the semiconductor chip is in the device region. Each of the interconnection patterns is at a pitch in a range of 10 μm to 40 μm, at least a portion of the input patterns have a bent region on the reinforcing region, and the bent region is bent at a predetermined angle within a range of 40° to 90° with respect to the second direction, and the reinforcing region is bent between the display panel and the driving printed circuit board.

BRIEF DESCRIPTION OF DRAWINGS

The above and other features of the inventive concepts will be more clearly understood from the following detailed description taken in conjunction with the accompanying drawings, in which.

DETAILED DESCRIPTION

Figure 1:
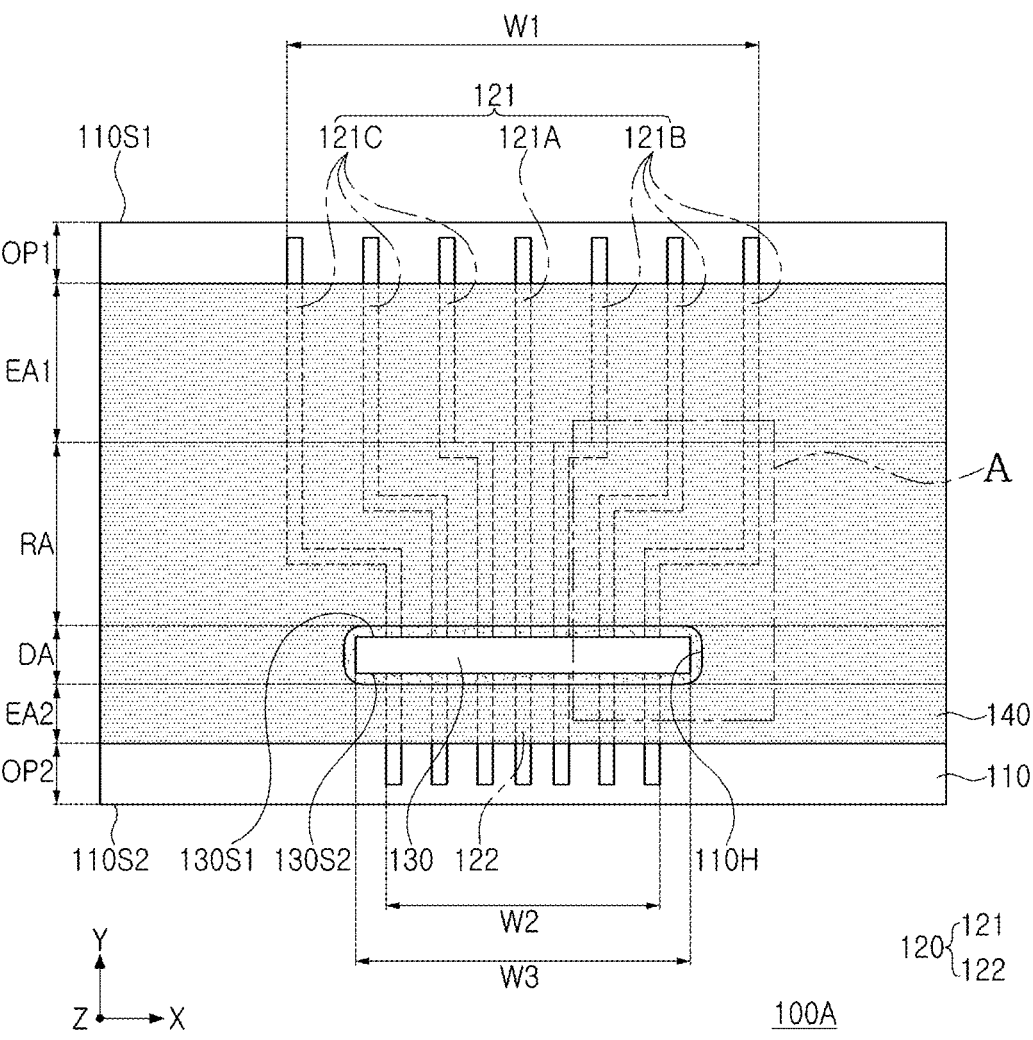
FIG. 1 is a plan view illustrating a film package according to an example embodiment of the inventive concepts.

Hereinafter, some example embodiments of the inventive concepts will be described with reference to the accompanying drawings. Hereinafter, terms such as 'an upper side, 'an upper portion,' 'an upper surface,' a lower side, a lower portion, a lower surface, and the like, may be understood as referring to the drawings, except where otherwise indicated by reference numerals.

Figure 2:
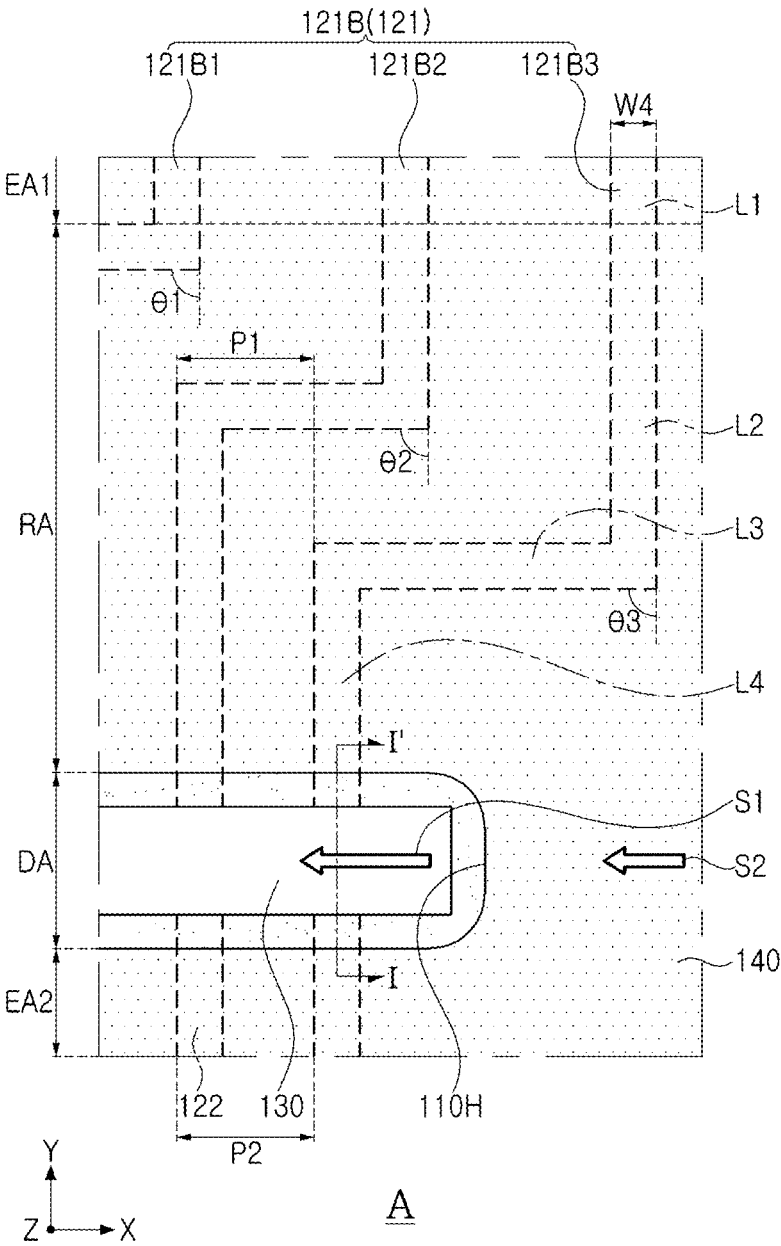
FIG. 2 is an enlarged view of part A of FIG. 1.

FIG. 1 is a plan view illustrating a film package according to an example embodiment of the inventive concepts. FIG. 2 is an enlarged view of part A of FIG. 1, and FIG. 3 is a cross-sectional view illustrating a cross-section taken along line I-I' of FIG. 2.

Figure 3:
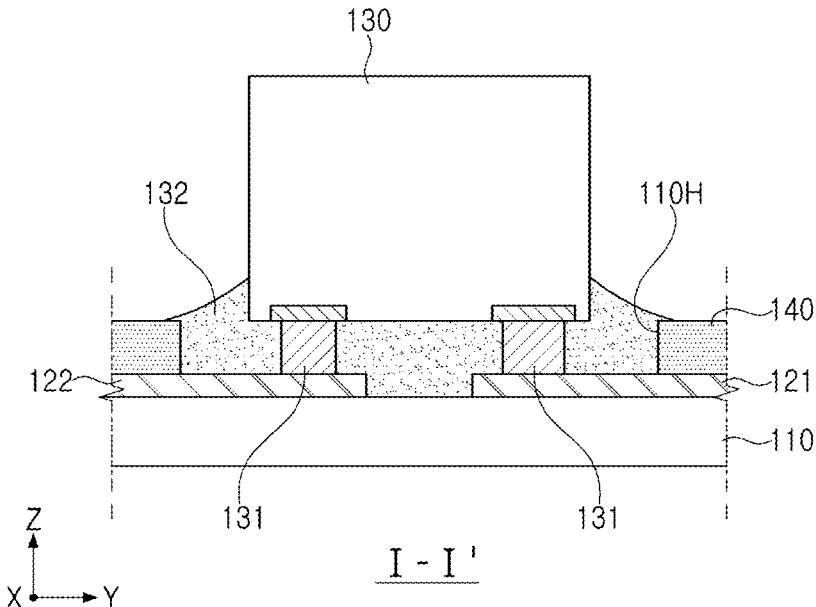
FIG. 3 is a cross-sectional view illustrating a cross-section taken along line I-I' of FIG. 2.

Referring to FIGS. 1 to 3, a film package 100A according to an example embodiment may include a film substrate 110, interconnection patterns 120, a semiconductor chip 130, and a protective layer 140.

The film substrate 110 is a support substrate on which the semiconductor chip 130 is mounted, and may have a first side 110S1 and a second side 110S2 disposed to oppose each other in a first direction (e.g., an X-direction). The first side 110S1 and the second side 110S2 may be side surfaces of the film substrate 110 spaced apart from each other in a direction in which the interconnection patterns 120 extend.

In the film substrate 110, a device region DA, a reinforcing region RA, a connection region EA, and connection regions OP1 and OP2 may be defined in a second direction (e.g., a Y-direction), orthogonal to the first direction (e.g., X-direction).

The device region DA is a region in which the semiconductor chip 130 is mounted, and may be disposed between the first side 110S1 and the second side 110S2 of the film substrate 110.

The reinforcing region RA is a region for inhibiting or preventing deformation of the device region DA, and may be disposed adjacent to at least one side of the device region DA in the second direction (e.g., Y-direction). According to an example embodiment, a case in which the reinforcing region RA is disposed on one side of the device region DA is illustrated. In some example embodiments, the reinforcing region RA may be disposed on both sides of the device region DA. The reinforcing region RA is a region including a region in which the interconnection patterns 120 are bent, and the bent region may reinforce the film substrate 110 to relieve deformation of the film substrate 110, which will be described later.

The connection region EA is a region connecting the device region DA and the reinforcing region RA to the first connection region OP1 and the second connection region OP2, respectively. The first connection region OP1 and the second connection region OP2 are regions in contact with an external device (e.g., a printed circuit board), and may be disposed on both sides of the film substrate 110 with respect to the second direction (e.g., Y-direction), to include the first side 110S1 or the second side 110S2 of the film substrate 110.

The film substrate 110 may be a flexible film including polyimide, which is a material having, e.g., an excellent coefficient of thermal expansion and durability. The material of the film substrate 110 is not limited thereto, and the film substrate 110 may be formed of, for example, an epoxy-based resin, acrylic, a synthetic resin such as polyether nitrile, polyether sulfone, polyethylene terephthalate, polyethylene naphthalate, or the like.

Referring to FIGS. 1 to 3, the semiconductor chip 130 may be disposed in the device region DA on the film substrate 110, and may have a first side surface 130S1 and a second side surface 130S2 extending in a first direction (e.g., X-direction) to face the first side 110S1 and the second side 110S2, respectively. For example, the semiconductor chip 130 may be formed in an elongated rod shape in one direction. The semiconductor chip 130 may be electrically connected to the input patterns 121 and the output patterns 122. The semiconductor chip 130 may be mounted to be elongated in the first direction (e.g., X-direction) in the device region DA on the film substrate 110 by a flip-chip bonding method. The semiconductor chip 130 may be physically and electrically connected to the interconnection patterns 120 through the connection bumps 131 (e.g., solder balls). An underfill resin 132 sealing the connection bump 131 may be formed between the semiconductor chip 130 and the film substrate 110. The underfill resin 132 may be formed using, for example, an insulating resin such as an epoxy resin. The underfill resin 132 may be formed to surround the connection bump 131 in a first opening 110H of the protective layer 140.

The semiconductor chip 130 may be a display driver IC (DDI) used to drive a display. For example, the semiconductor chip 130 may include at least one source driving circuit generating an image signal using a data signal transmitted from a timing controller and outputting an image signal to the display panel (e.g., refer to '500' in FIG. 11A), and at least one gate driving circuit outputting a scan signal including an on/off signal of the transistor to the display panel (e.g., refer to '500' of FIG. 12A). According to an example embodiment, the semiconductor chip 130 may be provided as a plurality of semiconductor chips each including a source driving circuit and a gate driving circuit.

During a reflow process for mounting the semiconductor chip 130 on the film substrate 110, the semiconductor chip 130 is heated to a value in a range of about 400 to about 500° C., and the film substrate 110 is heated to a value in a range of about 70 to about 100° C. A thermal expansion amount of the semiconductor chip 130 is lower than a thermal expansion amount of the film substrate 110, but since bonding is performed in a heated state at a relatively higher temperature than the film substrate 110, in a cooling process after the bonding process, an amount of contraction of the semiconductor chip 130 is greater than an amount of contraction of the film substrate 110. Accordingly, a stress S1, greater than a stress S2 applied to the film substrate 110 is applied to the semiconductor chip 130 (e.g., refer to FIG. 2). Due to a difference in stress, the semiconductor chip 130 causes deformation in a region adjacent to the semiconductor chip 130 while the film substrate 110 is cooled and contracted. In particular, when the semiconductor chip 130 has a bar shape, since the amount of contraction contracted in the longitudinal direction is relatively large, greater deformation of the film substrate 110 occurs in the longitudinal direction of the semiconductor chip 130. The film 110 substrate is deformed while forming a curve on a surface thereof. In some example embodiments, the bumps of the semiconductor chip 130 may be misaligned with the film substrate 110, and bonding defects may occur.

According to some example embodiments, by forming the interconnection patterns 120 having a region bent in the longitudinal direction of the semiconductor chip 130 in the reinforcing region RA of the film substrate 110, a difference in external force between the semiconductor chip 130 and the film substrate 110 may be alleviated. Accordingly, the deformation of the film substrate 110 may be reduced, and thus the bonding defect of the semiconductor chip 130 may be reduced. A point at which the difference in external force between the semiconductor chip 130 and the film substrate 110 is alleviated by the reinforcing region RA will be described later.

The interconnection patterns 120 may be electrically connected to the semiconductor chip 130, and may be conductive patterns extending from a chip mounting surface of the film substrate 110 to an edge of the film substrate 110. For example, the interconnection patterns 120 may include input patterns 121 extending to the first side 110S1 of the film substrate 110 and output patterns 122 extending to the second side 110S2 of the film substrate 110. A width W1 of a region in which the input patterns 121 are disposed may be greater than a width W2 of a region in which the output patterns 122 are disposed, and the width W2 of the region in which the output patterns 122 are disposed may be less than the length W3 of the semiconductor chip 130. A line width W4 of the interconnection patterns 120 may have a uniform width, but example embodiments are not limited thereto, and some regions of the interconnection patterns 120 may have a thicker line width. Each of the input patterns 121 may be disposed at a first pitch P1, and each of the output patterns 122 may be disposed at a second pitch P2. The first pitch P1 and the second pitch P2 may be about 40 μm or less, such as, for example, in a range of about 10 μm to about 40 μm. More specifically, the first pitch P1 and the second pitch P2 may be in a range of about 10 μm to about 30 μm. The interconnection patterns 120 may be formed of, for example, aluminum foil or copper foil. For example, the interconnection patterns 120 may be formed by patterning a metal film formed on the film substrate 110 by a process such as casting, laminating, or electroplating. According to an example embodiment, the interconnection patterns 120 may include patterns respectively formed on the upper and lower surfaces of the film substrate 110, and interconnection vias penetrating through the film substrate 110 to interconnect the patterns.

Referring to FIGS. 1 and 2, the input patterns 121 may have one end being adjacent to a first side 110S1 of the film substrate 110 and the other end connected to a connection pad of the semiconductor chip 130, and may electrically connect the semiconductor chip 130 and an external device. That is, the input patterns 121 may be disposed on a first connection region OP1, a connection region EA1, and a reinforcing region RA of the film substrate 110, and may connect the first side 110S1 of the film substrate 110 and the semiconductor chip 130 of the device region DA.

Figure 4:
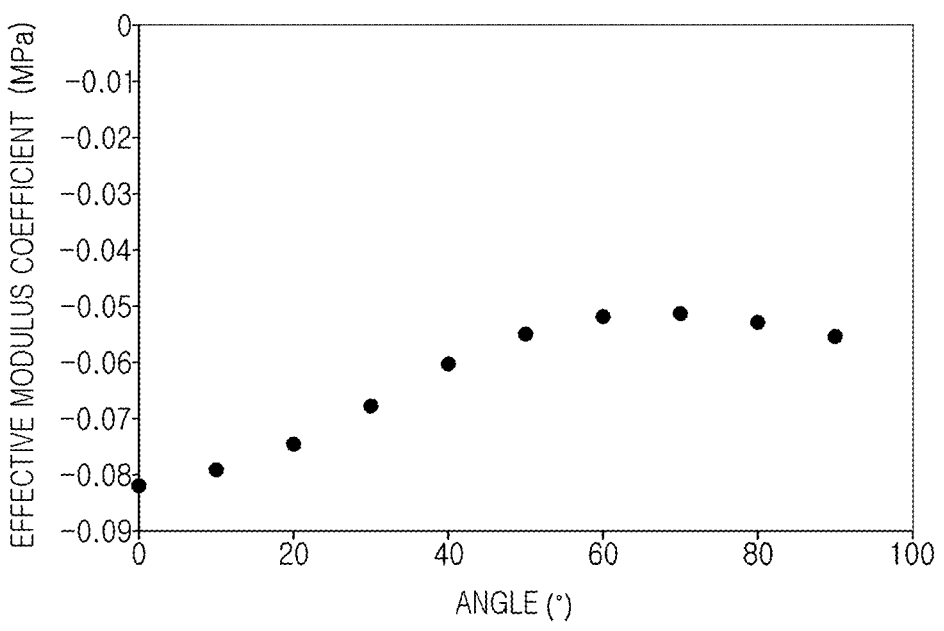
FIG. 4 is a graph illustrating a relationship between an angle of an interconnection pattern and an amount of expansion/contraction of a film package.
Figure 5:
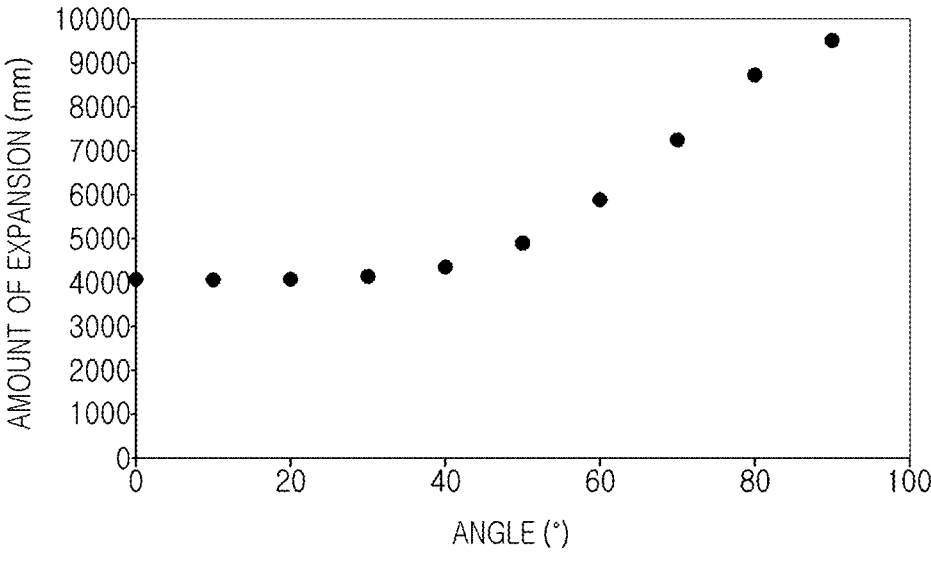
FIG. 5 is a graph illustrating a relationship between an angle of an interconnection pattern and an effective elastic modulus of a film package.

The input patterns 121 may be exposed externally on the first connection region OP1 of the film substrate 110, and may be disposed on the connection region EA in a second direction. A portion 121B and 121C among the input patterns 121 may include regions bent on the reinforcing region RA. According to an example embodiment, a portion 121A among the input patterns 121 may be formed in a straight line without a bent region. For example, the input patterns 121 may include a first portion L1 disposed on the first connection region EA1, and a second portion L2, a third portion L3, and a fourth portion L4, disposed on the reinforcing region RA. The first portion L1, the second portion L2, and the fourth portion L4 may be disposed in a second direction, and the third portion L3 may be a region bent in an inward direction of the film substrate 110, having a desired (or alternatively, predetermined) angle with respect to the first direction (e.g., X-direction) for the second portion L2. The desired (or alternatively, predetermined) angle may be an angle in a range of about 40° to about 90°. When the input patterns 121B include a first input pattern 121B1, a second input pattern 121B2, and a third input pattern 121B3, first to third angles Θ1, Θ2, and Θ3 in which each of the input patterns is refracted in the reinforcing region RA may be the same as each other, but example embodiments are not limited thereto, and the first to third angles Θ1, Θ2, and Θ3 may be different angles within a range of about 40° to about 90°. The reinforcing region RA of the film substrate 110 may have a higher effective elastic modulus than an effective modulus of elasticity of other regions (e.g., the device region) due to the bent region of the input patterns 121. In other words, the third portion L3 of the input patterns 121 disposed on the reinforcing region RA of the film substrate 110 may be disposed in a second direction (e.g., Y-direction), orthogonal to the first direction (e.g., X-direction) disposed in a longitudinal direction, to improve an effective elastic modulus of the reinforcing region RA. The reinforcing region RA may relieve deformation of the film substrate 110. An effect of the reinforcing region RA to relieve deformation of the film substrate 110 will be described with reference to FIGS. 4 and 5. FIG. 4 is a graph illustrating a relationship between an angle of the interconnection pattern and an amount of expansion/contraction of the film package, and FIG. 5 is a graph illustrating a relationship between an angle of the interconnection pattern and an effective modulus of elasticity of the film package.

Referring to FIG. 4, as an angle of the bent region increases from about 0° to about 40°, it can be seen that the amount of expansion/contraction of the film substrate 110 gradually decreases, and when the angle of the bent region becomes more than about 40°, an increase in the amount of expansion/contraction is reduced by more than about 30%. This is because, when the angle of the bent region is about 40° or more, the effective modulus of elasticity in the longitudinal direction (e.g., X-direction) of the semiconductor chip 130 of the film substrate 110 increases, and the amount of expansion/contraction is reduced. Referring to FIG. 5, as the angle of the bent region increases from about 0° to about 40°, the effective elastic modulus of the film substrate 110 hardly changes, but in a range in which the angle of the bent region is about 40° to about 90°, it can be seen that the effective elastic modulus gradually increases.

The output patterns 122 may have one end adjacent to the second side 110S2 of the film substrate 110, and the other end connected to the connection pad of the semiconductor chip 130, and may electrically connect an external device (e.g., a display panel) to the semiconductor chip 130. The output patterns 122 may be disposed in a second connection region OP2 and a second connection region EA2 of the film substrate 110.

The protective layer 140 may be disposed on the film substrate 110 to cover at least a portion of the interconnection patterns 120 in order to protect the interconnection patterns 120 from external physical and/or chemical damage. The protective layer 140 may have an opening 110H in which the semiconductor chip 130 is disposed. The protective layer 140 may include a first region 1400P3 exposing at least a portion of the input patterns 121, adjacent to the first side 110S1 and a second region 1400P4 exposing at least a portion of the output patterns 122, adjacent to the second side 110S2. The protective layer 140 may be formed of an insulating material, for example, solder resist or dry film resist.

Figure 6:
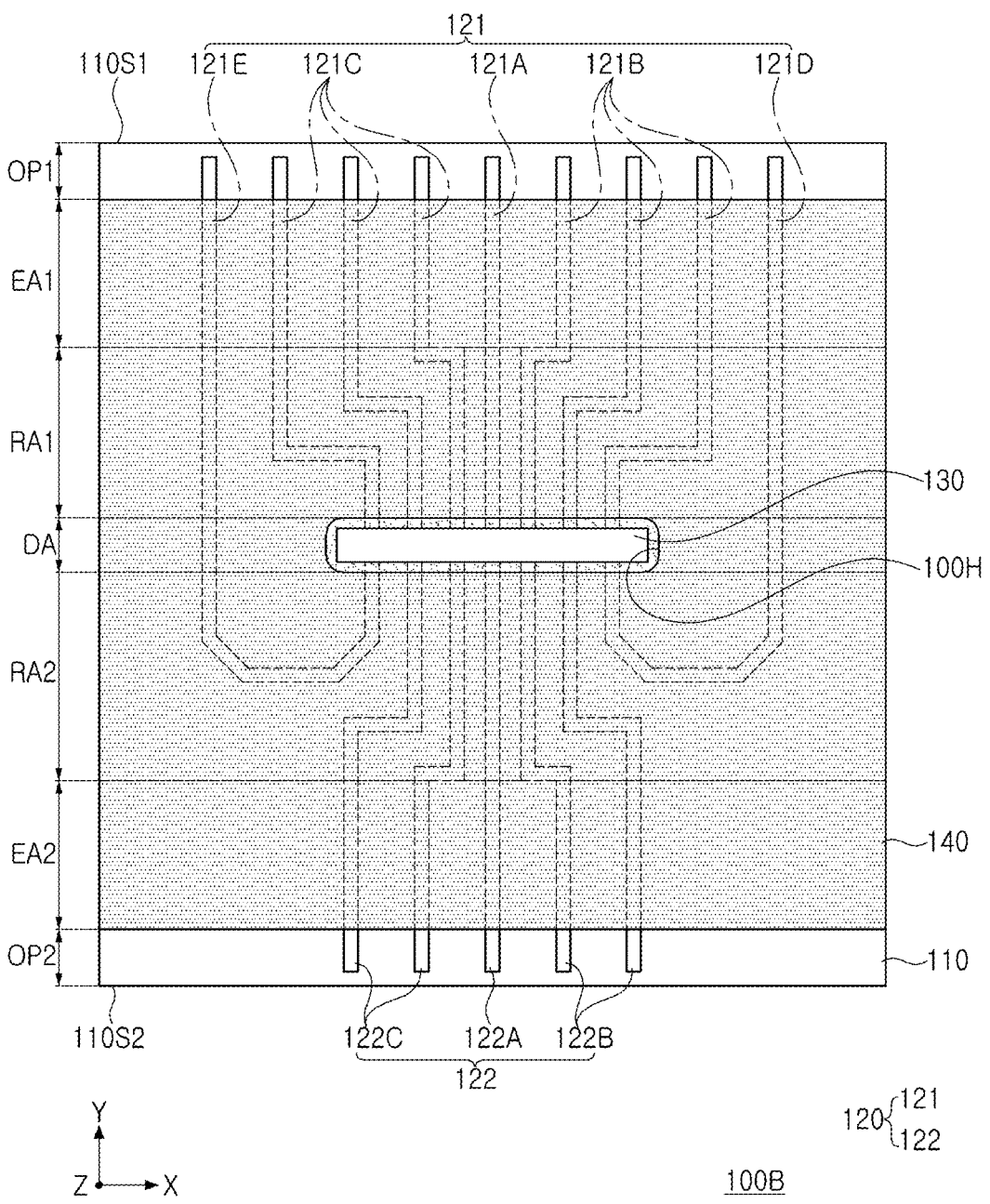
FIG. 6 is a plan view illustrating a film package according to an example embodiment of the inventive concepts.

Referring to FIG. 6, a film package 100B according to an example embodiment will be described. FIG. 6 is a plan view illustrating a film package according to an example embodiment of the inventive concepts. As compared to the film package 100A of the example embodiment described above, in a film package 100B of FIG. 6, there is a difference in that the reinforcing region RA2 is further disposed in the output patterns 122, and a portion of input patterns 121E and 121D among the input patterns 121 are connected to the second side 110S2 of the semiconductor chip 130. Since the other components are the same as those of the above-described example embodiment, detailed descriptions will be omitted to prevent repetition of description.

In the film package 100B according to an example embodiment, a first reinforcing region RA1 and a second reinforcing region RA2 may be respectively disposed on both sides of the device region DA in the second direction (e.g., Y-direction). Accordingly, since the first reinforcing region RA1 and the second reinforcing region RA2 are respectively disposed on both sides of the semiconductor chip 130 disposed in the device region DA, an effect of alleviating deformation of the film substrate 110 is may be further improved.

Figure 7:
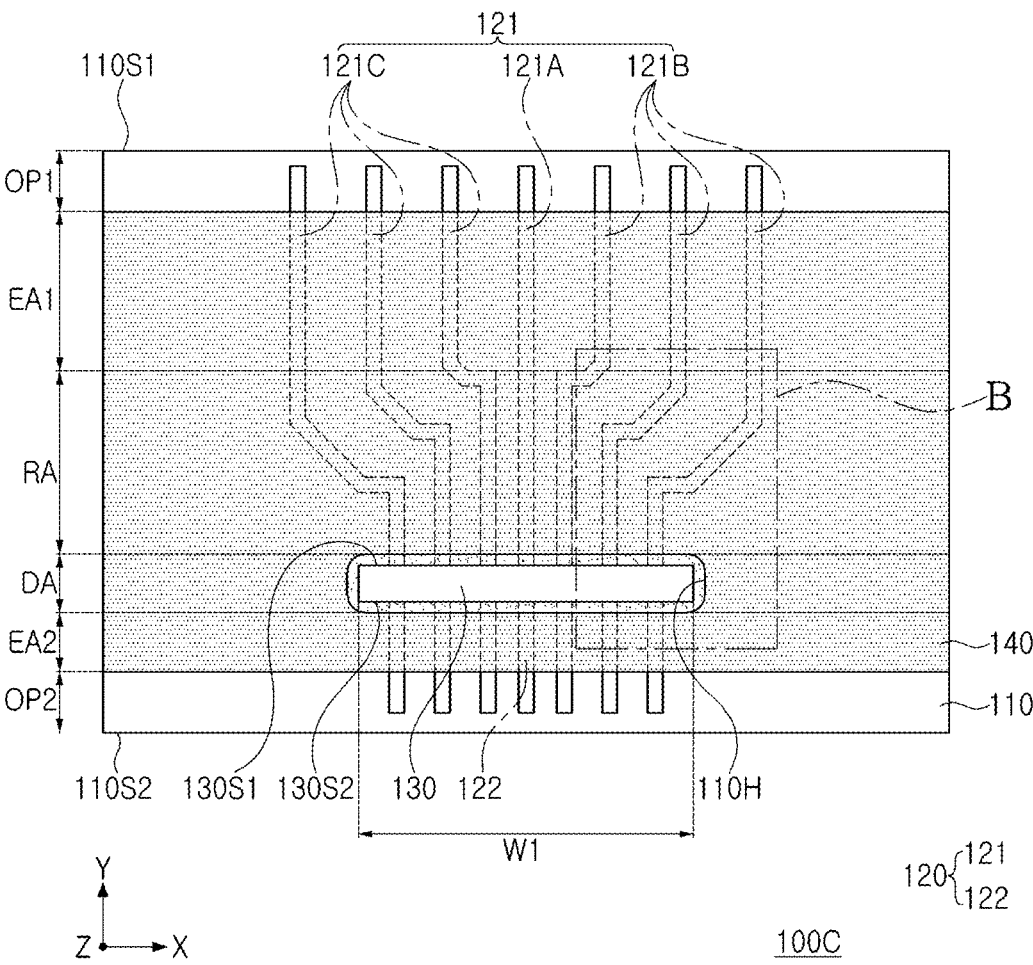
FIG. 7 is a plan view illustrating a film package according to an example embodiment of the inventive concepts.
Figure 8:
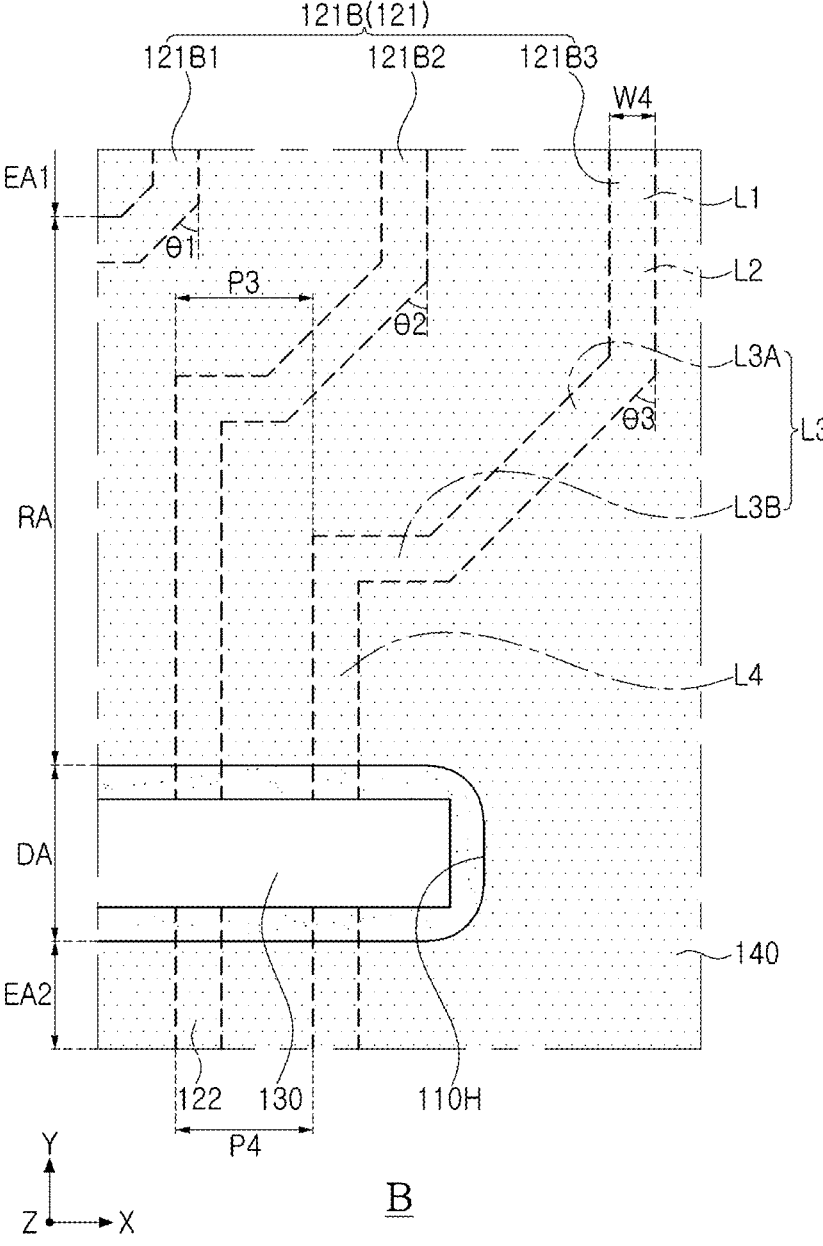
FIG. 8 is an enlarged view of part B of FIG. 7.

A film package 100C according to an example embodiment will be described with reference to FIGS. 7 and 8. FIG. 7 is a plan view illustrating a film package according to an example embodiment of the inventive concepts, and FIG. 8 is an enlarged view of part B of FIG. 7.

As compared to the film package 100A of the example embodiment described above, in a film package 100C of FIG. 7, there is a difference in that the input patterns 121 disposed in the reinforcing region RA are bent in two steps. In other words, the third portion L3 of the input patterns 121 may include a 3-1 portion L3A and a 3-2 portion L3B, and the 3-2 portion LA3B may be bent at first to third angles $\Theta1$, $\Theta2$, and $\Theta3$ that are smaller than the 3-1 portion L3A with respect to the second direction (e.g., Y-direction). Each of the input patterns 121 may be disposed at a third pitch P3, and each of the output patterns 122 may be disposed at a fourth pitch P4. The third pitch P3 and the fourth pitch P4 may be about 40 μm or less, such as, for example, in a range of about 10 μm to about 40 μm. More specifically, the third pitch P3 and the fourth pitch P4 may be in a range of about 10 μm to about 30 μm. Since the other components are the same as those of the above-described example embodiment, detailed descriptions will be omitted to prevent repetition of the description.

Figure 9:
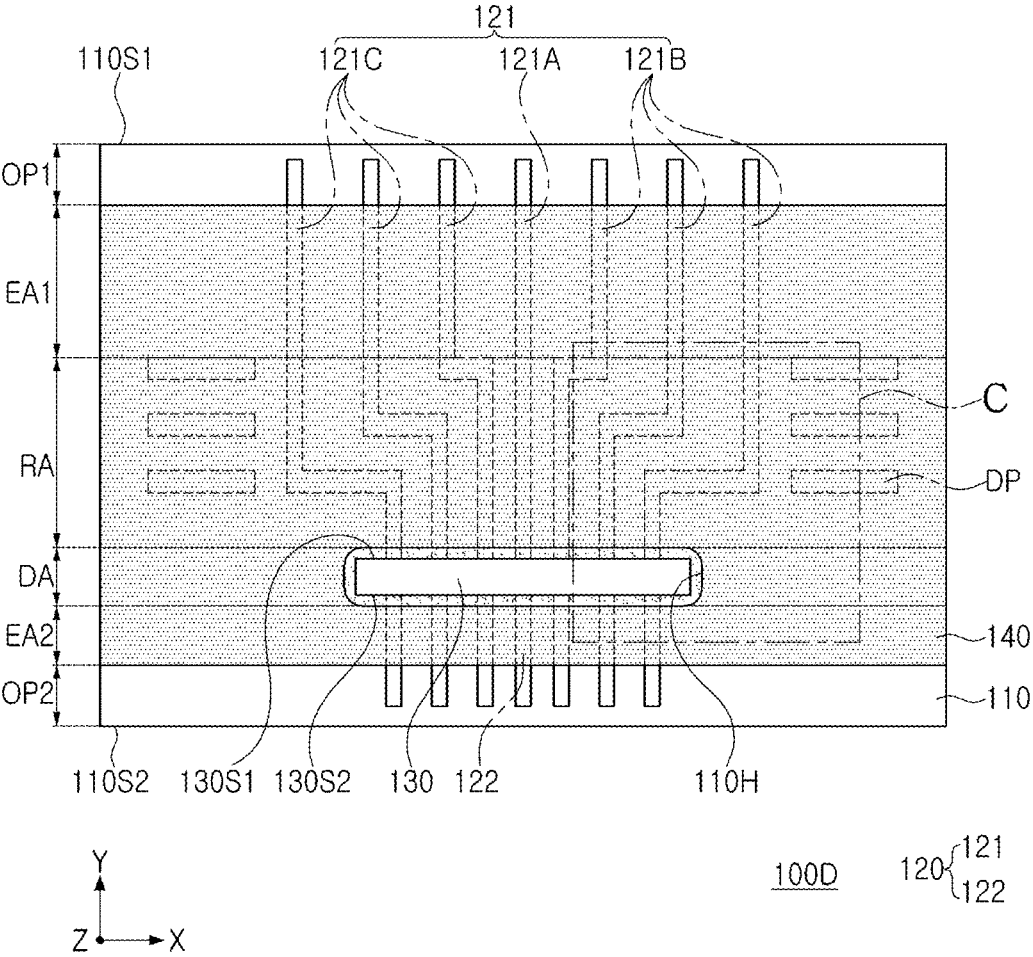
FIG. 9 is a plan view illustrating a film package according to an example embodiment of the inventive concepts.
Figure 10:
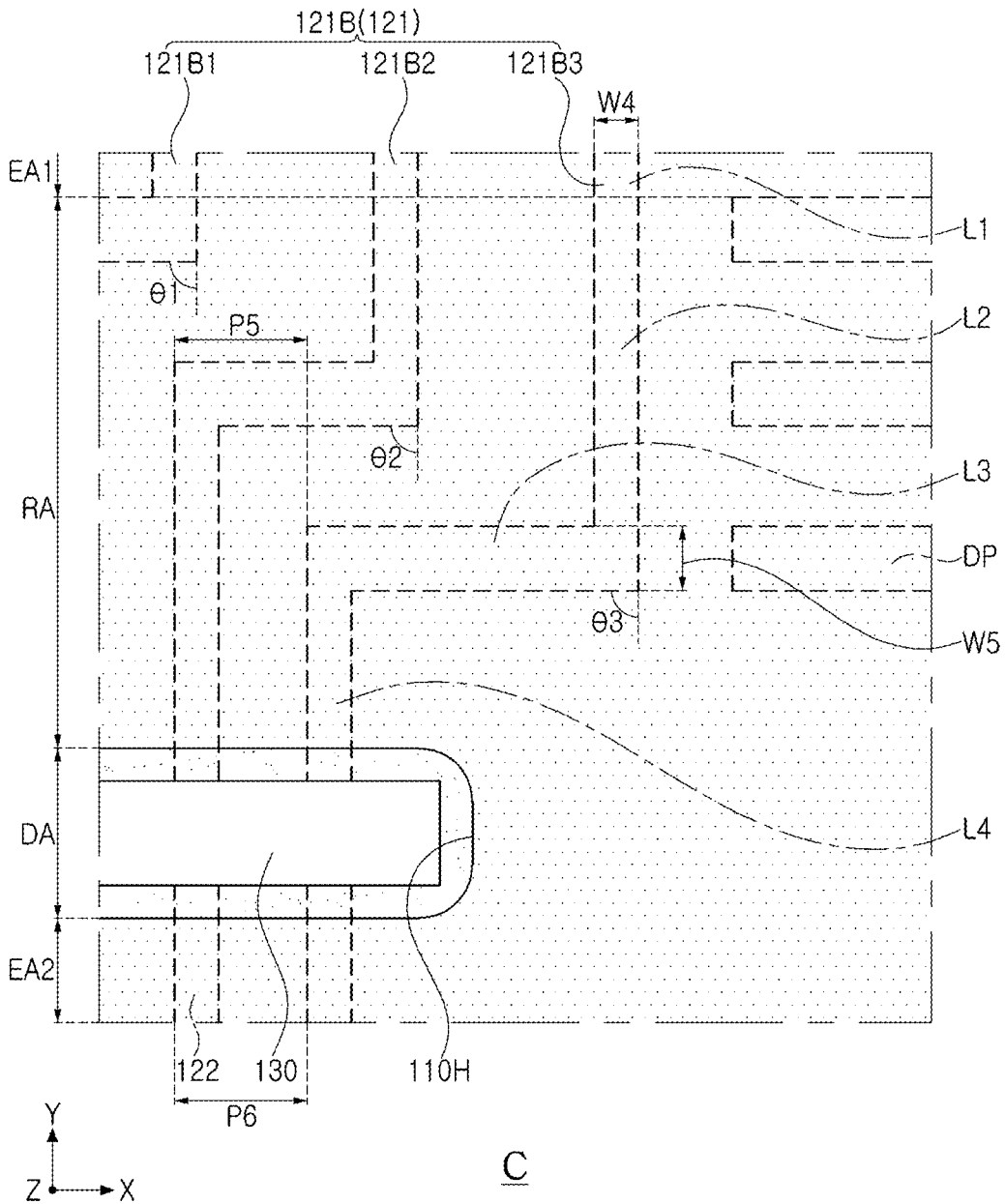
FIG. 10 is an enlarged view of part C of FIG. 9.

A film package 100D according to an example embodiment will be described with reference to FIGS. 9 and 10. FIG. 9 is a plan view illustrating a film package according to an example embodiment of the inventive concepts, and FIG. 10 is an enlarged view of part C of FIG. 9.

As compared to the film package 100A of the example embodiment described above, in the film package 100D of FIG. 9, there is a difference in that one portion of input patterns 121 disposed in the reinforcing region RA has a thicker line width than the other portion thereof, and dummy patterns, separated from the input patterns 121 are further disposed in the reinforcing region RA. A bent portion of the input patterns 121 may have a thicker line width W5 than the other portions. In other words, a third portion L3 of the input patterns 121 may be a line width W5, thicker than a line width W4 of a first portion L1, a second portion L2, and a third portion L3. Therefore, an effect of dispersing a stress of the semiconductor chip 130 in the reinforcing region RA may be further improved. In addition, the dummy patterns DP may be disposed in the first direction (e.g., X-direction)

of the reinforcing region RA, to further improve the effect of dispersing the stress of the semiconductor chip 130 in the reinforcing region RA. According to an example embodiment, the line width of the dummy patterns DP can be the same or substantially the same as the line length W5 of the third portion L3. Each of the input patterns 121 may be disposed at a fine pitch P5, and each of the output patterns 122 may be disposed at a sixth pitch P6. The fifth pitch P5 and the sixth pitch P6 may be about 40 μm or less, such as, for example, in a range of about 10 μm to about 40 μm. More specifically, the fifth pitch P5 and the sixth pitch P6 may be in a range of about 10 μm to about 30 μm. Since the other components are the same as those of the above-described example embodiment, detailed descriptions will be omitted to prevent repetition of the description.

Figure 11A:
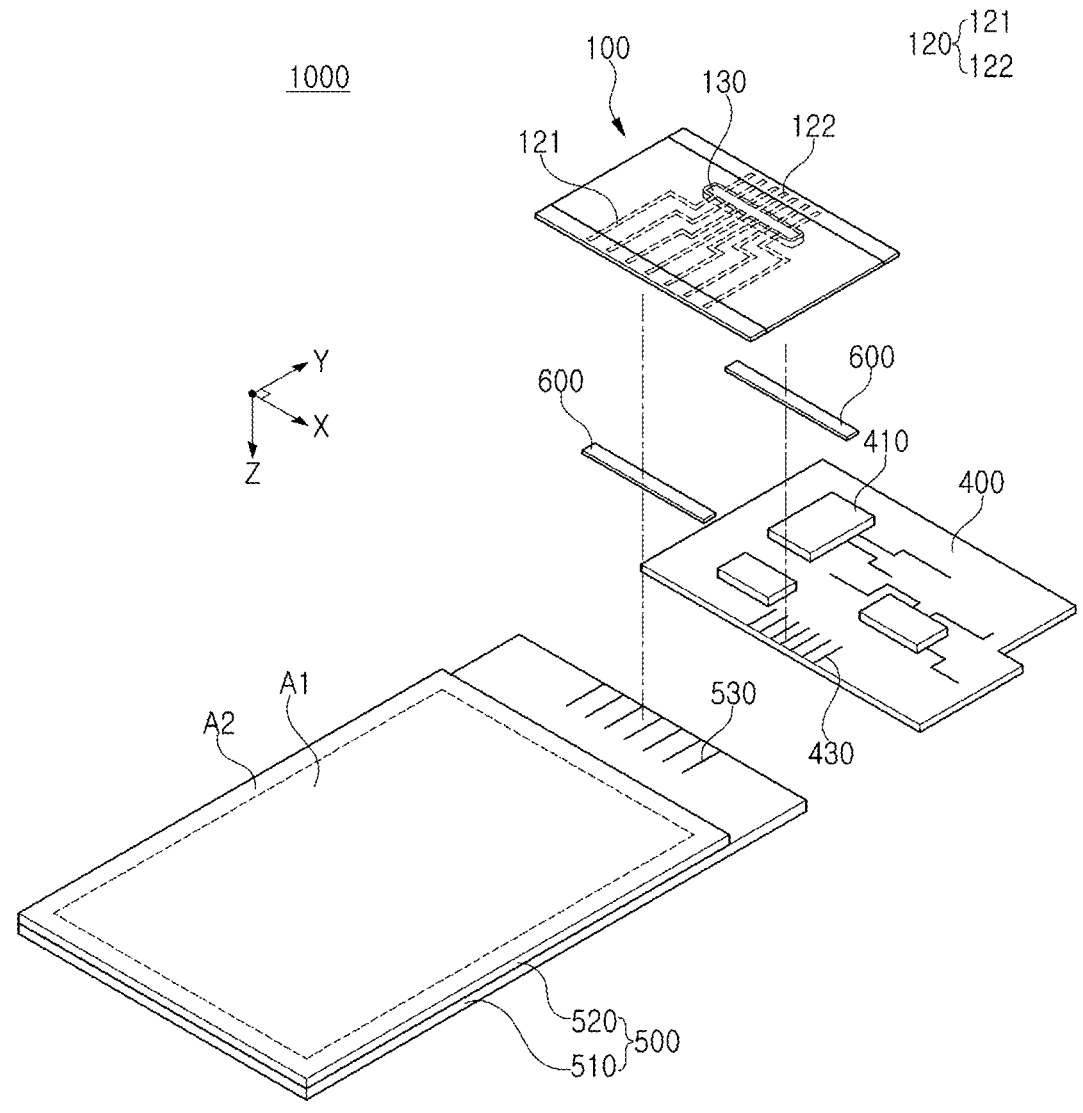
FIG. 11A is a perspective view illustrating a package module including a film package according to an example embodiment of the inventive concepts.
Figure 11B:
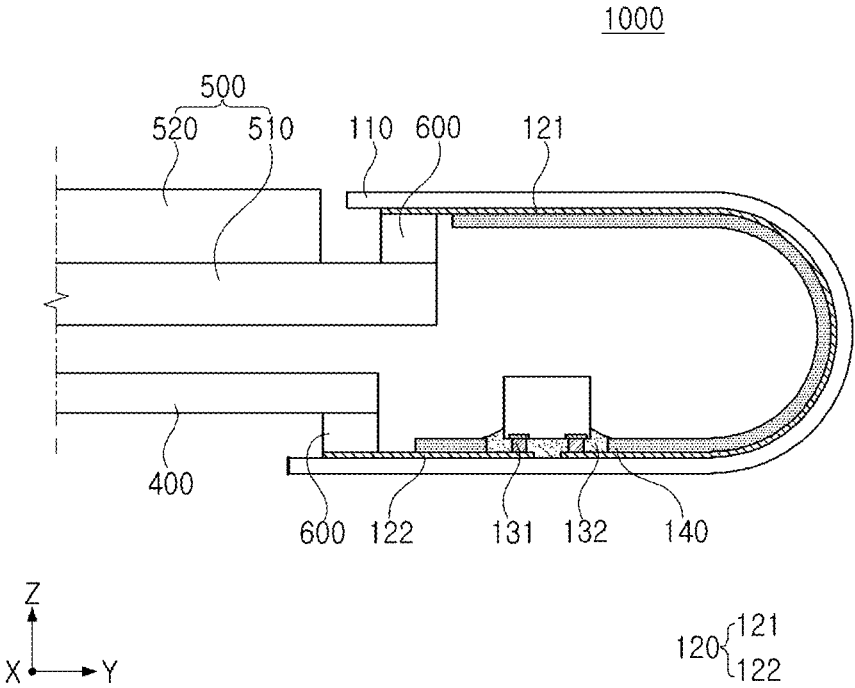
FIG. 11B is a cross-sectional view illustrating a usage state of the package module of FIG. 11A.

FIG. 11A is a perspective view illustrating a package module including a film package according to an example embodiment of the inventive concepts, and FIG. 11B is a cross-sectional view illustrating a use state of the package module of FIG. 11A. FIG. 11B illustrates a state in which the film package 100 is bent in the package module 1000 of FIG. 11A.

Referring to FIGS. 11A and 11B, the package module 1000 may include at least one film package 100, a driving printed circuit board 400, and a display panel 500. The display panel 500 may be overlapped on the driving printed circuit board 400, and the film package 100 may be bent to connect the display panel 500 and the driving printed circuit board 400. The film package 100 according to an example embodiment may be understood to have the same configuration as the film package 100A described above in FIG. 1. The bent region of the film package 100 according to an example embodiment may be a reinforcing region RA of the film package 100A described above in FIG. 1.

The film package 100 may include a display driving IC DDI. For example, the semiconductor chip 130 may generate an image signal using a data signal transmitted from a timing controller, and may include at least one source driving circuit outputting an image signal to the display panel 500 and at least one gate driving circuit outputting a scan signal including an on/off signal of a transistor to the display panel 500. According to an example embodiment, the semiconductor chip 130 may be provided as a plurality of semiconductor chips each including a source driving circuit and a gate driving circuit.

The film package 100 may be connected to each of the driving printed circuit board 400 and the display panel 500. The interconnection patterns 120 of the film package 100 may be electrically connected to each of the driving connection interconnection 430 of the driving printed circuit board 400 and the panel connection interconnection 530 of the display panel 500. The film package 100 may receive a signal output from the driving printed circuit board 400 and transmit the same to the display panel 500.

In an example embodiment, the package module 1000 may include one film package 100. For example, when the display panel 500 is to provide a screen of a small area, such as a mobile phone, or supports a relatively low resolution, the driving printed circuit board 400 and the display panel 500 may be interconnected through one film package 100. In some example embodiments, the film package 100 may be connected to one side of the display panel 500.

According to an example embodiment, the package module 1000 may comprise a plurality of film packages 100. For example, when the display panel 500 is to provide a screen of a large area, such as a television, or supports a relatively high resolution, the driving printed circuit board 400 and the display panel 500 may be interconnected through a plurality of film packages 100. In some example embodiments, one or a plurality of the plurality of film packages 100 may be connected to each of two or more side sides of the display panel 500.

In the film package 100, input patterns (or pads) 121 may be exposed at one end, and output patterns (or pads) 122 may be formed at the other end. Each of the input patterns 121 and the output patterns 122 may be connected to each of a driving connection interconnection 430 of the driving printed circuit board 400 and a panel connection interconnection 530 of the display panel 500 by an anisotropic conductive layer 600. The anisotropic conductive layer 600 may be an anisotropic conductive film or an anisotropic conductive paste in which conductive particles are dispersed in an insulating adhesive layer. The anisotropic conductive layer 600 is interposed between opposing electrodes, so that electricity is conducted only in a direction (e.g., Z-axis direction) of the electrodes facing each other, and may have anisotropic electrical properties that are insulated from adjacent electrodes in a direction (e.g., X-axis direction) between the electrodes.

One or more driving circuit chips 410 capable of simultaneously or sequentially applying power and a signal to the film package 100 may be mounted on the driving printed circuit board 400.

The display panel 500 may be, for example, a liquid crystal display (LCD) panel, a light emitting diode (LED) panel, an organic LED (OLED) panel, a plasma display panel (PDP), or the like.

The display panel 500 may comprise a transparent substrate 510, an image region 520 formed on the transparent substrate 510, and a panel connection interconnection 530. The transparent substrate 510 may be, for example, a glass substrate or a transparent flexible substrate. The image region 520 may comprise a display region A1 for displaying an image and a peripheral region A2 for applying a driving signal to the display region A1. A plurality of pixels in the display area A1 may be connected to a plurality of panel connection interconnections 530 corresponding to each other, and may be operated according to a signal provided by the display driving IC DDI mounted on the film package 100.

As set forth above, in some example embodiments, a film package and a package module in which shrinkage of a film substrate is alleviated and bonding defects of a semiconductor chip is reduced, may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, some example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe some example embodiments rather than limiting the inventive concepts. In some example embodiments, singular forms include plural forms unless interpreted otherwise in context.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments have been shown and described above, it will be apparent to those skilled in the art that modifications and variations could be made without departing from the scope of the inventive concepts.

What is claimed is:

1. A film package, comprising:

a film substrate extending in a first direction, the film substrate including a first side and a second side facing each other, the film substrate including a device region between the first side and the second side, and the film substrate including a reinforcing region adjacent to at least one side of the device region in a second direction, the second direction intersecting the first direction;

a semiconductor chip having an elongated rod shape, and the semiconductor chip on the device region of the film substrate in the first direction;

interconnection patterns electrically connected to the semiconductor chip, the interconnection patterns comprising input patterns extending toward the first side on the film substrate and output patterns extending toward the second side on the film substrate;

a protective layer on the film substrate to cover at least a portion of the interconnection patterns, and the protective layer including an opening in which the semiconductor chip is in the device region;

a connection bump connecting the semiconductor chip and the interconnection patterns; and an underfill resin surrounding the connection bump in the opening, wherein each of the interconnection patterns is at a pitch in a range of 10 μm to 40 μm, wherein each space between adjacent interconnection patterns in a region adjacent to the first side is greater than each space between adjacent interconnection patterns in a region adjacent to the device region, and wherein at least a portion of the input patterns include a bent region on the reinforcing region, and the bent region includes a first portion in the second direction, and a second portion bent from the first portion at an angle of 90° with respect to the second direction.

2. The film package of claim 1, wherein the bent region comprises
a third portion bent in the first direction from the second portion.

3. The film package of claim 2, wherein the interconnection patterns are at equal intervals.

4. The film package of claim 2, wherein the interconnection patterns have an interval in a region adjacent to the second side, greater than an interval in a region adjacent to the device region.

5. The film package of claim 1, wherein the bent region is bent from an outside of the film substrate to a center thereof.

6. The film package of claim 1, wherein the protective layer comprises
a first connection region exposing at least a portion of the input patterns, the first connection region adjacent to the first side; and
a second connection region exposing at least a portion of the output patterns, the second connection region adjacent to the second side.

7. The film package of claim 1, wherein, in the interconnection patterns, a line width in the bent region is greater than a line width in a region other than the bent region.

8. The film package of claim 1, wherein the semiconductor chip has a length in the first direction, greater than a length in the second direction.

9. The film package of claim 1, further comprising:
at least one dummy pattern separated from the input patterns in the reinforcing region.

10. The film package of claim 9, wherein the dummy pattern is in the first direction.

11. The film package of claim 1, wherein the semiconductor chip is a display driver integrated circuit.

12. The film package of claim 1, wherein at least a portion of the output patterns include a bent region on the reinforcing region, and the bent region is bent at an angle within a range of 40° to 90° with respect to the second direction.

13. The film package of claim 1, wherein the semiconductor chip includes a first side surface facing the first side and a second side surface facing the second side.

14. The film package of claim 13, wherein
the input patterns extend from the first side surface, and the output patterns extend from the second side surface.

15. The film package of claim 13, wherein a portion of the input patterns extend from the second side surface.

16. A film package, comprising:
a film substrate including a device region in a first direction and a reinforcing region adjacent to at least one side of the device region;
a semiconductor chip having an elongated rod shape in a second direction orthogonal to the first direction, and the semiconductor chip on the device region;
interconnection patterns on the film substrate, the interconnection patterns electrically connected to the semiconductor chip, and extending from the semiconductor chip onto the reinforcing region;
a connection bump connecting the semiconductor chip and the interconnection patterns; and
an underfill resin surrounding the connection bump, wherein each of the interconnection patterns is at a pitch in a range of 10 μm to 40 μm,
wherein each space between adjacent interconnection patterns in a region adjacent to the at least one side is greater than each space between adjacent interconnection patterns in a region adjacent to the device region, and
wherein at least a portion of the interconnection patterns have a bent region on the reinforcing region, and the bent region includes a first portion in the second direction, and a second portion bent from the first portion at an angle of 90° in the second direction.

17. The film package of claim 16, wherein the interconnection patterns comprise:
input patterns electrically connected to the semiconductor chip, and extending toward a first side on the film substrate; and
output patterns extending toward a second side on the film substrate.

18. The film package of claim 16, wherein an effective modulus of elasticity of the reinforcing region is greater than an effective modulus of elasticity of the device region.

19. A package module, comprising:
a display panel;
a driving printed circuit board below the display panel; and
a film package that is bent between the display panel and the driving printed circuit board, the film package connecting the display panel and the driving printed circuit board, the film package configured to receive a signal output from the driving printed circuit board, and transmit the signal output from the driving printed circuit board to the display panel,
wherein the film package includes
a film substrate extending in a first direction and including a first side and a second side facing each other, the film substrate including a device region between the first side and the second side, and the film substrate including a reinforcing region adjacent to at least one side of the device region in a second direction intersecting the first direction;
a semiconductor chip having an elongated rod shape, and the semiconductor chip on the device region of the film substrate in the first direction;
interconnection patterns electrically connected to the semiconductor chip, the interconnection patterns comprising input patterns extending toward the first side on the film substrate and output patterns extending toward the second side on the film substrate;
a protective layer on the film substrate to cover at least a portion of the interconnection patterns, and the protective layer including an opening in which the semiconductor chip is in the device region;
a connection bump connecting the semiconductor chip and the interconnection patterns; and
an underfill resin surrounding the connection bump in the opening,
wherein each of the interconnection patterns is at a pitch in a range of 10 μm to 40 μm,
wherein each space between adjacent interconnection patterns in a region adjacent to the first side is greater than each space between adjacent interconnection patterns in a region adjacent to the device region,
wherein at least a portion of the input patterns have a bent region on the reinforcing region, and the bent region includes a first portion in the second direction, and a second portion bent from the first portion at an angle of 90° with respect to the second direction, and wherein the reinforcing region is bent between the display panel and the driving printed circuit board.

* * * * *